(12) United States Patent
Kumar et al.

(10) Patent No.: US 12,034,440 B2
(45) Date of Patent: Jul. 9, 2024

(54) COMBINATION SCHEME FOR BASELINE WANDER, DIRECT CURRENT LEVEL SHIFTING, AND RECEIVER LINEAR EQUALIZATION FOR HIGH SPEED LINKS

(71) Applicant: Advanced Micro Devices, Inc., Santa Clara, CA (US)

(72) Inventors: Rajesh Kumar, Santa Clara, CA (US); Edoardo Prete, Boxborough, MA (US); Gerald R. Talbot, Boxborough, MA (US); Ethan Crain, Boxborough, MA (US); Tracy J. Feist, Fort Collins, CO (US); Jeffrey Cooper, Fort Collins, CO (US)

(73) Assignee: Advanced Micro Devices, Inc., Santa Clara, CA (US)

( * ) Notice: Subject to any disclaimer, the term of this patent is extended or adjusted under 35 U.S.C. 154(b) by 0 days.

(21) Appl. No.: 17/566,199

(22) Filed: Dec. 30, 2021

(65) Prior Publication Data

US 2023/0134926 A1    May 4, 2023

Related U.S. Application Data

(60) Provisional application No. 63/275,852, filed on Nov. 4, 2021.

(51) Int. Cl.
*H03K 19/01* (2006.01)
*H03K 19/0175* (2006.01)
*H03F 3/45* (2006.01)

(52) U.S. Cl.
CPC . *H03K 19/017509* (2013.01); *H03F 3/45475* (2013.01)

(58) Field of Classification Search
CPC ......... G06F 3/00; G06F 3/1295; H03K 5/003; H03K 19/0175
(Continued)

(56) References Cited

U.S. PATENT DOCUMENTS 5,107,201 A * 4/1992 Ogle ..................... G01R 15/06
324/149
6,654,462 B1 * 11/2003 Hedberg ............. H04L 25/0276
379/404

(Continued)

OTHER PUBLICATIONS

International Search Report and Written Opinion in International Application No. PCT/US2022/077853, dated Feb. 3, 2023, 13 pages.

*Primary Examiner* — Quan Tra
(74) *Attorney, Agent, or Firm* — Kowert, Hood, Munyon, Rankin & Goetzel, P.C.; Rory D. Rankin

(57) ABSTRACT

Systems, apparatuses, and methods for implementing a combo scheme for direct current (DC) level shifting of signals are disclosed. A receiver circuit receives an input signal on a first interface. The first interface is coupled to a resistor in parallel with a capacitor which passes the input signal to a second interface. Also, the first interface is coupled to a first pair of current sources between ground and a voltage source, and the second interface is coupled to a second pair of current sources between ground and the voltage source. An op-amp drives the current sources based on a difference between a sensed common mode voltage and a reference voltage. Based on this circuit configuration, the receiver circuit is able to prevent baseline wander, perform a DC level shift of the input signal, and achieve linear equalization of the input signal.

20 Claims, 13 Drawing Sheets

(58) Field of Classification Search
USPC ......................................................... 327/333
See application file for complete search history.

(56) References Cited

U.S. PATENT DOCUMENTS

| | | | |
|---|---|---|---|
| 7,224,189 B1* | 5/2007 | Ziazadeh | H03K 19/018564 |
| | | | 326/86 |
| 7,330,320 B1 | 2/2008 | Oberg et al. | |
| 7,589,649 B1* | 9/2009 | Aga | G11B 7/005 |
| | | | 341/120 |
| 7,679,853 B2 | 3/2010 | Song et al. | |
| 7,720,141 B2 | 5/2010 | Fang et al. | |
| 8,461,896 B2 | 6/2013 | Zhuang | |
| 8,798,204 B2* | 8/2014 | Chen | H04L 25/0276 |
| | | | 375/257 |
| 10,651,739 B1* | 5/2020 | Li | H02S 20/32 |
| 2007/0264031 A1* | 11/2007 | Dalton | H04B 10/69 |
| | | | 398/208 |
| 2008/0057900 A1 | 3/2008 | Fang et al. | |
| 2008/0063091 A1 | 3/2008 | Dong et al. | |
| 2010/0157464 A1 | 6/2010 | Mathew et al. | |
| 2012/0133459 A1 | 5/2012 | Zhuang et al. | |
| 2021/0075653 A1 | 3/2021 | Rogers et al. | |
| 2021/0104980 A1* | 4/2021 | Kokatsu | H03F 1/3211 |

* cited by examiner

COMBINATION SCHEME FOR BASELINE WANDER, DIRECT CURRENT LEVEL SHIFTING, AND RECEIVER LINEAR EQUALIZATION FOR HIGH SPEED LINKS

CROSS REFERENCE TO RELATED APPLICATIONS

This application claims priority to the U.S. Provisional Patent Application Ser. No. 63/275,852, entitled "COMBINATION SCHEME FOR BASELINE WANDER, DIRECT CURRENT LEVEL SHIFTING, AND RECEIVER LINEAR EQUALIZATION FOR HIGH SPEED LINKS", filed Nov. 4, 2021, the entirety of which is incorporated herein by reference.

BACKGROUND

Description of the Related Art

Baseline wander is a common issue for any alternating current (AC) coupled serializer/deserializer (SerDes) link. It is noted that baseline wander is sometimes referred to as DC wander. Whenever a long string of 1's or 0's is transmitted on a signal path, the signal has energy in the low frequency part of the spectrum which is not effectively transmitted by the AC coupling capacitor. The rejected part of the signal creates low frequency noise which is especially harmful for multi-level signaling (e.g., pulse amplitude modulation 4-level (PAM4)) because of smaller eye separation. This is also an important issue for cases when the AC capacitor is placed on the semiconductor die as compared to on the circuit board. When the AC capacitor is on the die, it typically cannot be made too large as compared to when it is on the circuit board. The typical solution for baseline wander involves a feedback mechanism, where the effect of baseline wander is estimated and added back to the input as a correction. The feedback involves a finite amount of delay, which means the correction mechanism can never be perfect, leading to a non-zero impairment in the link budget due to baseline wander.

BRIEF DESCRIPTION OF THE DRAWINGS

The advantages of the methods and mechanisms described herein may be better understood by referring to the following description in conjunction with the accompanying drawings, in which.

DETAILED DESCRIPTION OF IMPLEMENTATIONS

In the following description, numerous specific details are set forth to provide a thorough understanding of the methods and mechanisms presented herein. However, one having ordinary skill in the art should recognize that the various implementations may be practiced without these specific details. In some instances, well-known structures, components, signals, computer program instructions, and techniques have not been shown in detail to avoid obscuring the approaches described herein. It will be appreciated that for simplicity and clarity of illustration, elements shown in the figures have not necessarily been drawn to scale. For example, the dimensions of some of the elements may be exaggerated relative to other elements.

Various systems, apparatuses, and methods for implementing a combo scheme for direct current (DC) level shifting of signals are disclosed herein. In one implementation, a receiver circuit receives an input signal on a first interface. The first interface is coupled to a resistor in parallel with a capacitor which passes the input signal to a second interface. The combination of the receiver in parallel with the capacitor at the input adds a zero to the overall receiver transfer function and acts as a linear equalizer for low frequency signals. Also, the first interface is coupled to a first pair of current sources between ground and a voltage source, and the second interface is coupled to a second pair of current sources between ground and the voltage source. In one implementation, the current through the current sources is automatically adjusted by a common mode feedback op-amp. This op-amp has one input as the sensed common mode at the input pads ($VCM_{PAD}$) and the other input as the desired common mode voltage reference ($VCM_{REF}$). The current is continuously adjusted to maintain $VCM_{PAD}=VCM_{REF}$ across process, voltage, and temperature variation. Based on this circuit configuration, the receiver circuit is able to prevent baseline wander, perform a DC level shift of the input signal, and achieve linear equalization of the input signal.

Figure 1:
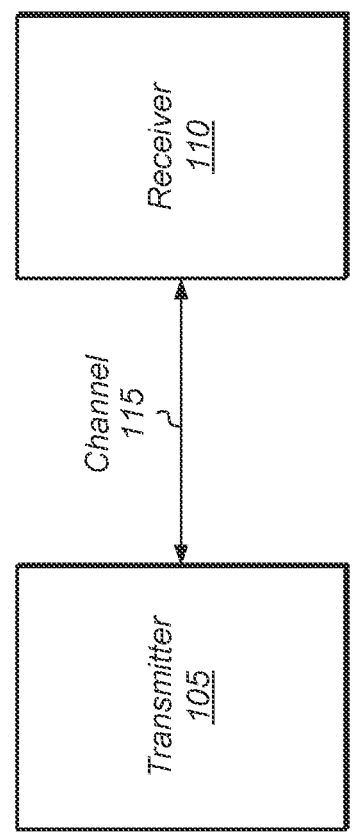
FIG. 1 is a block diagram of one implementation of a generic computer or communication system including a transmitter and a receiver.

Referring now to FIG. 1, a block diagram of one implementation of a generic computer or communication system 100 including a transmitter 105 and a receiver 110 is shown. In one implementation, transmitter 105 transmits data to receiver 110 over communication channel 115. Communication channel 115 can include any number of individual connections (i.e., signal paths) between transmitter 105 and receiver 110, with the number of connections varying according to the implementation. Also, the individual connections of communication channel 115 can support differential and/or single-ended signals. In one implementation, differential signals include two signals that are out of phase and equal in amplitude. For example, one signal of the differential signal may represent a positive signal while the other may represent a negative signal. A single-ended signal is one signal carrying data that transitions between two voltage levels, such as between ground (i.e., 0 Volts) and a supply voltage (i.e., VDD). Throughout this disclosure, many of the circuits are described in terms of supporting differential signals. However, one skilled in the art will understand that these circuits can also be adapted to support single-ended signals. Depending on the implementation, communication channel 115 is a cable, backplane, one or more metal traces, or other type of communication channel. For example, in one implementation, channel 115 is one or more metal traces between two chips of a multi-chip module. At the physical layer, the communication between the transmitter 105 and the receiver device 110 can be unidirectional or bidirectional according to a given transmission protocol. It is noted that system 100 can include any number and type of other devices. Additionally, system 100 can include any number of transmitter-receiver pairs dispersed throughout the system.

Transmitter 105 and receiver 110 can be any type of devices depending on the implementation. For example, in one implementation, transmitter 105 is a processing unit (e.g., central processing unit (CPU), graphics processing unit (GPU)) and receiver 110 is a memory device. The memory device can be any type of memory, such as dynamic random access memory (DRAM), synchronous DRAM (SDRAM), double data rate (DDR, DDR2, DDR3, etc.) SDRAM (including mobile versions of the SDRAMs such as mDDR3, etc., and/or low power versions of the SDRAMs such as LPDDR2, etc.), RAMBUS DRAM (RDRAM), static random access memory (SRAM), etc. One or more memory devices can be coupled onto a circuit board to form memory modules such as single inline memory modules (SIMMs), dual inline memory modules (DIMMs), etc. Alternatively, the memory devices can be mounted within a system on chip (SoC) or integrated circuit (IC) in a chip-on-chip configuration, a package-on-package configuration, or a multi-chip module (MCM) configuration.

In another implementation, transmitter 105 is an input/output (I/O) fabric and receiver 110 is a peripheral device. The peripheral devices can include devices for various types of wireless communication, such as Wi-Fi, Bluetooth®, cellular, Global Positioning System (GPS), etc. The peripheral devices can also include additional storage, including random access memory (RAM) storage, solid state storage, or disk storage. The peripheral devices can also include user interface devices such as a display screen, including touch display screens or multitouch display screens, keyboard or other input devices, microphones, speakers, etc. In other implementations, transmitter 105 and receiver 110 are other types of devices. It is noted that system 100 can be any type of system, such as an IC, SoC, MCM, and so on.

Figure 2:
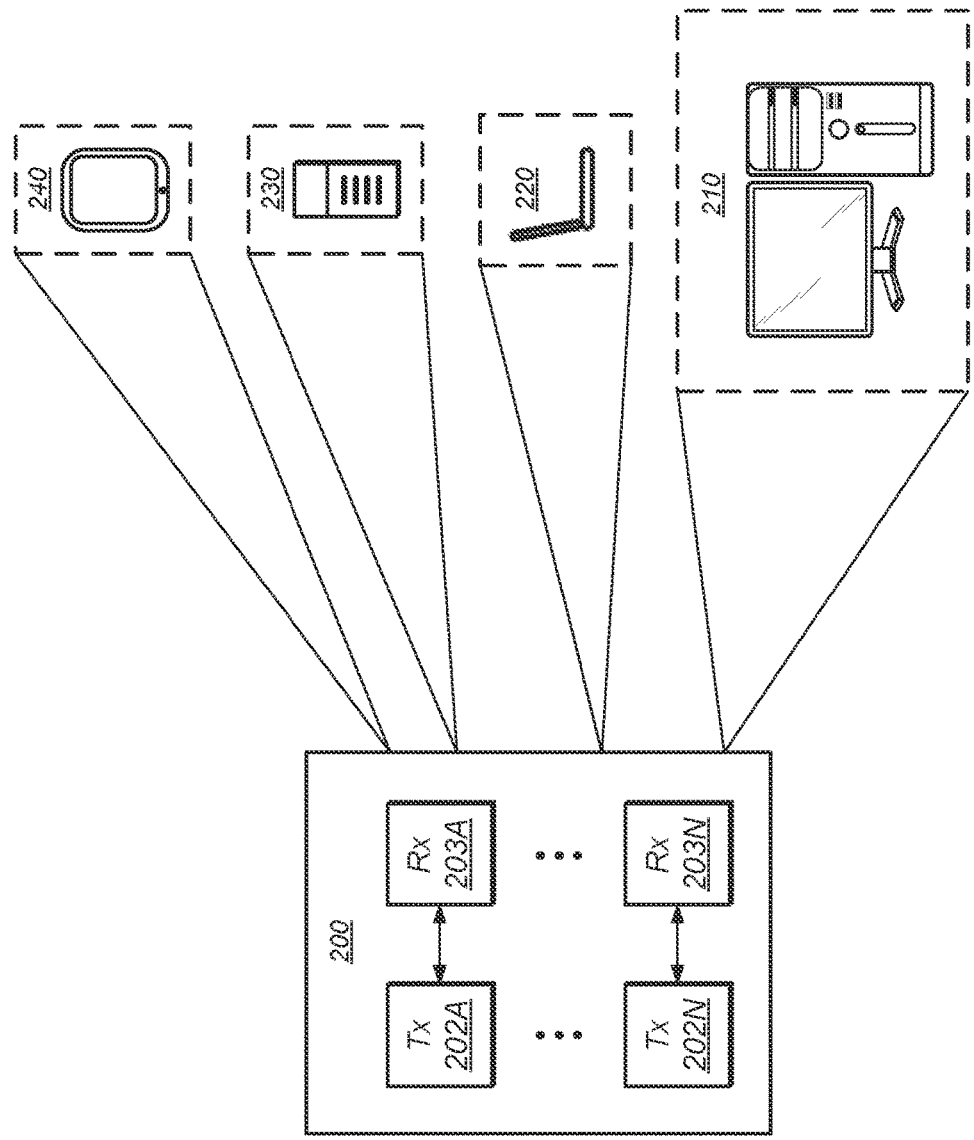
FIG. 2 is a block diagram of one implementation of a computing system.

Turning now to FIG. 2, a block diagram of one implementation of a computing system 200 is shown. As shown, system 200 represents chip, circuitry, components, etc., of a desktop computer 210, laptop computer 220, server 230, mobile device 240, or otherwise. Other systems, apparatuses, and devices (e.g., game consoles, wearable devices, Internet of things (IoT) devices, peripheral devices) are possible and are contemplated. In the illustrated implementation, the system 200 includes any number of pairs of transmitters 202A-N and receivers 203A-N.

Figure 3:
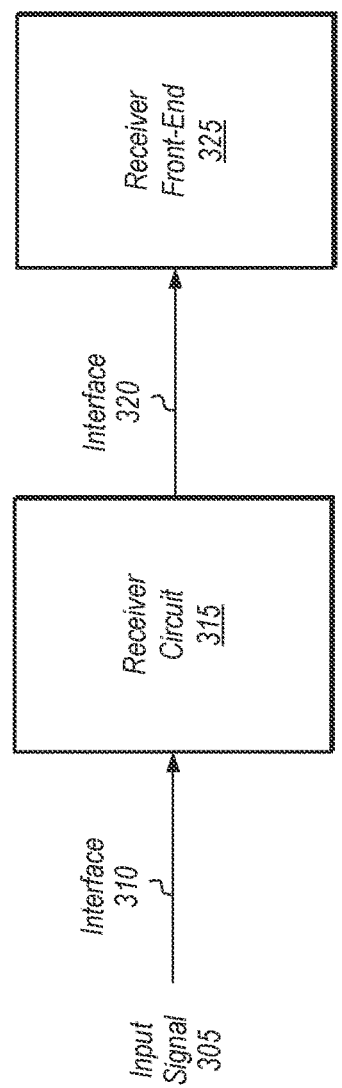
FIG. 3 is a block diagram of one implementation of a receiver.

Referring now to FIG. 3, a block diagram of one implementation of a receiver 300 is shown. In one implementation, receiver 110 (of FIG. 1) includes one or more instances of the components of receiver 300. Input signal 305 is received on interface 310 by receiver circuit 315. In one implementation, input signal 305 is a differential signal and interface 310 includes two separate physical connections. In another implementation, input signal 305 is a single-ended signal and interface 310 includes one physical connection.

In one implementation, receiver circuit 315 achieves three different goals for input signal 305 received on interface 310 before passing the conditioned signal to interface 320. In this implementation, receiver circuit 315 prevents baseline wander (i.e., DC wander), performs DC level shifting, and achieves linear equalization for input signal 305. Examples of different ways of implementing receiver circuit 315 will be provided throughout the remainder of this disclosure. After being coupled to interface 320, the output signal from receiver 315 is provided to receiver front-end 325. The receiver front-end 325 can prepare the signal for being sampled to extract data carried by the signal.

Figure 4:
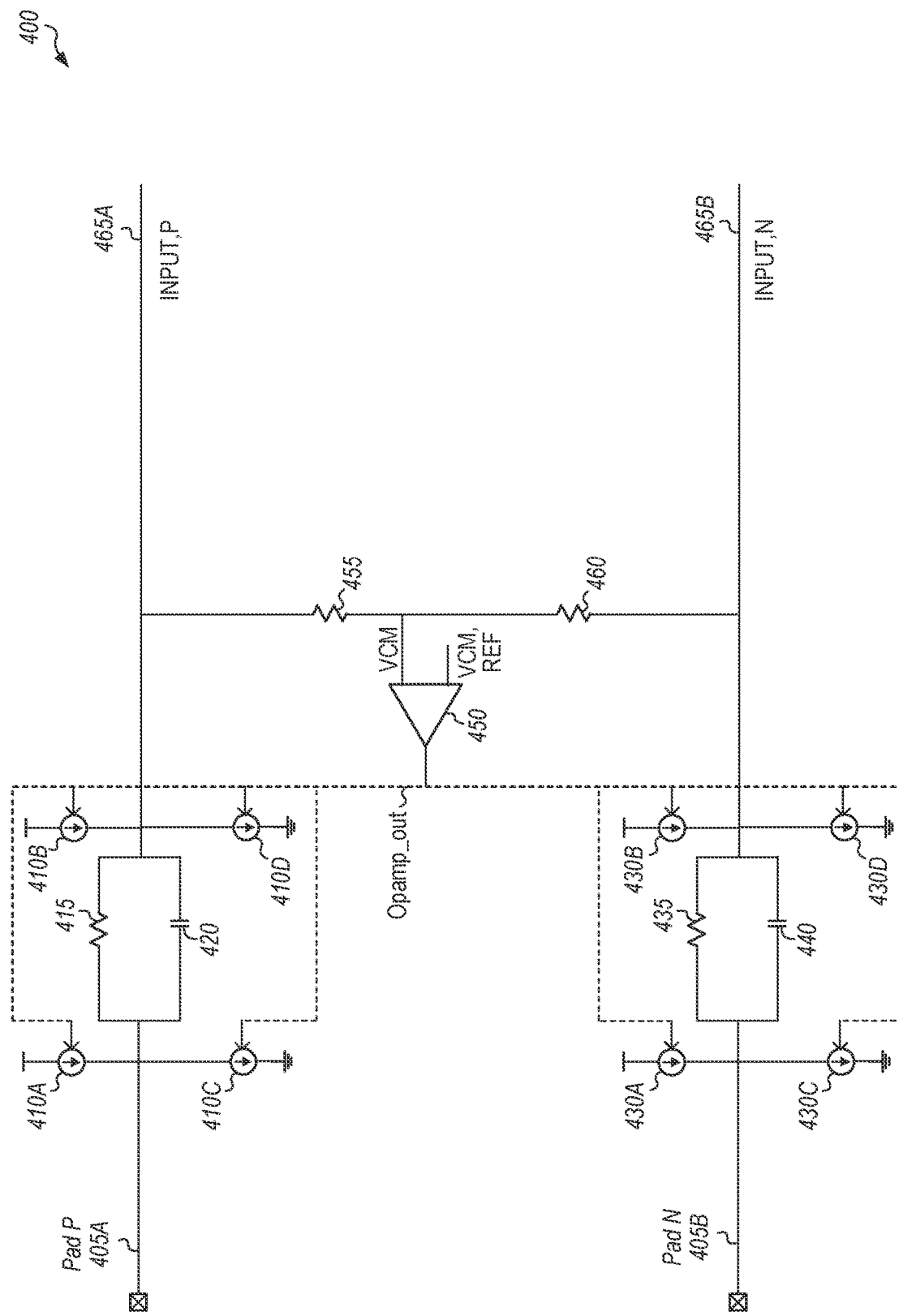
FIG. 4 is a block diagram of one implementation of a receiver circuit.

Turning now to FIG. 4, a block diagram of one implementation of a receiver circuit 400 is shown. In one implementation, receiver circuit 315 includes the components and structure shown for receiver circuit 400. In one implementation, a differential input data signal is received by receiver circuit 400 on channels 405A-B. For example, in one implementation the positive signal of the differential signal is received by 405A and the negative signal of the differential signal is received by 405B. Two current sources 410A and 410C are coupled to pad 405A, with a first leg of current source 410A coupled to a voltage supply and a second leg of current source 410A coupled to pad 405A, and with a first leg of current source 410C coupled to pad 405A and a second leg of current source 410C coupled to ground. Similarly, two current sources 430A and 430C are coupled to pad 405B, with a first leg of current source 430A coupled to a voltage supply and a second leg of current source 430A coupled to pad 405B, and with a first leg of current source 430C coupled to pad 405B and a second leg of current source 430C coupled to ground.

Receiver pad 405A is coupled to a first leg of resistor 415 and a first leg of capacitor 420, with resistor 415 and capacitor 420 arranged in a parallel fashion. It is noted that receiver pad 405A can also be referred to as first differential signal line input 405A. It is also noted that the line extending from receiver pad 405A can also be referred to as transmission line 405A, signal path 405A, or signal line 405A. A second leg of resistor 415 and a second leg of capacitor 420 are coupled to receiver front end signal line input 465A. It is noted that the line extending from receiver front end signal line input 405A can also be referred to as transmission line 465A, signal path 465A, or signal line 465A. Also, two current sources 410B and 410D are coupled to signal line input 465A, with a first leg of current source 410B coupled to a voltage supply and a second leg of current source 410B coupled to signal line input 465A, and with a first leg of current source 410D coupled to signal line input 465A and a second leg of current source 410D coupled to ground.

Similarly, receiver pad 405B is coupled to a first leg of resistor 435 and a first leg of capacitor 440, with resistor 435 and capacitor 440 arranged in a parallel fashion. A second leg of resistor 435 and a second leg of capacitor 440 are coupled to receiver front end signal line input 465B. Also, two current sources 430B and 430D are coupled to signal line input 465B, with a first leg of current source 430B coupled to a voltage supply and a second leg of current source 430B coupled to signal line input 465B, and with a first leg of current source 430D coupled to signal line input 465B and a second leg of current source 430D coupled to ground.

A pair of resistors 455 and 460 arranged in a serial fashion are coupled between receiver front end signal line input 465A and receiver front end signal line input 465B. The midpoint of resistors 455 and 460 is coupled to a first input of op-amp 450, and a reference voltage is coupled to a second input of op-amp 450. The output of op-amp 450 is coupled to current sources 410A-D and 430A-D. Op-amp 450 controls the flow of current through current sources 410A-D and 430A-D to achieve the proper DC level on signal line inputs 465A-B to match what is expected by the subsequent circuit (e.g., receiver front-end circuit).

Receiver circuit 400 is able to prevent baseline wander, shift a DC level of an input signal, and achieve linear equalization. A typical SerDes link employs the use of a finite impulse response (FIR) filter at the transmitter to attenuate low frequency components of the data signal with respect to high frequency components. This leads to a flatter response at the receiver end of the channel. Additionally, a receiver may use a decision feedback equalizer (DFE) to cancel one or more previously transmitted bits of data. However, these techniques do not provide sufficient attenuation for lower frequency components (lower than $1/20^{th}$ of the Nyquist frequency). This results in a residual intersymbol interference (ISI) when long strings of 1's or 0's are transmitted through the channel. However, the receiver circuit 400 presented in FIG. 4 repurposes the circuit used for avoiding baseline wander to act as a linear equalizer at lower frequencies. This is achieved by the addition of a low frequency zero (e.g., at ~800 Mhz for 16 GHz Nyquist frequency).

It should be understood that receiver circuit 400 is merely one example of a receiver circuit for preventing baseline wander, shifting a DC level of an input signal, and achieving linear equalization. In other implementations, other combinations of components and/or other suitable structures of a receiver circuit can be employed. In other words, it should be understood that variations to the arrangements of components shown for receiver circuit 400 can be employed in other implementations. Two examples of variations are presented for receiver circuit 500 (of FIG. 5) and receiver circuit 700 (of FIG. 7) and are described in further detail below.

Figure 5:
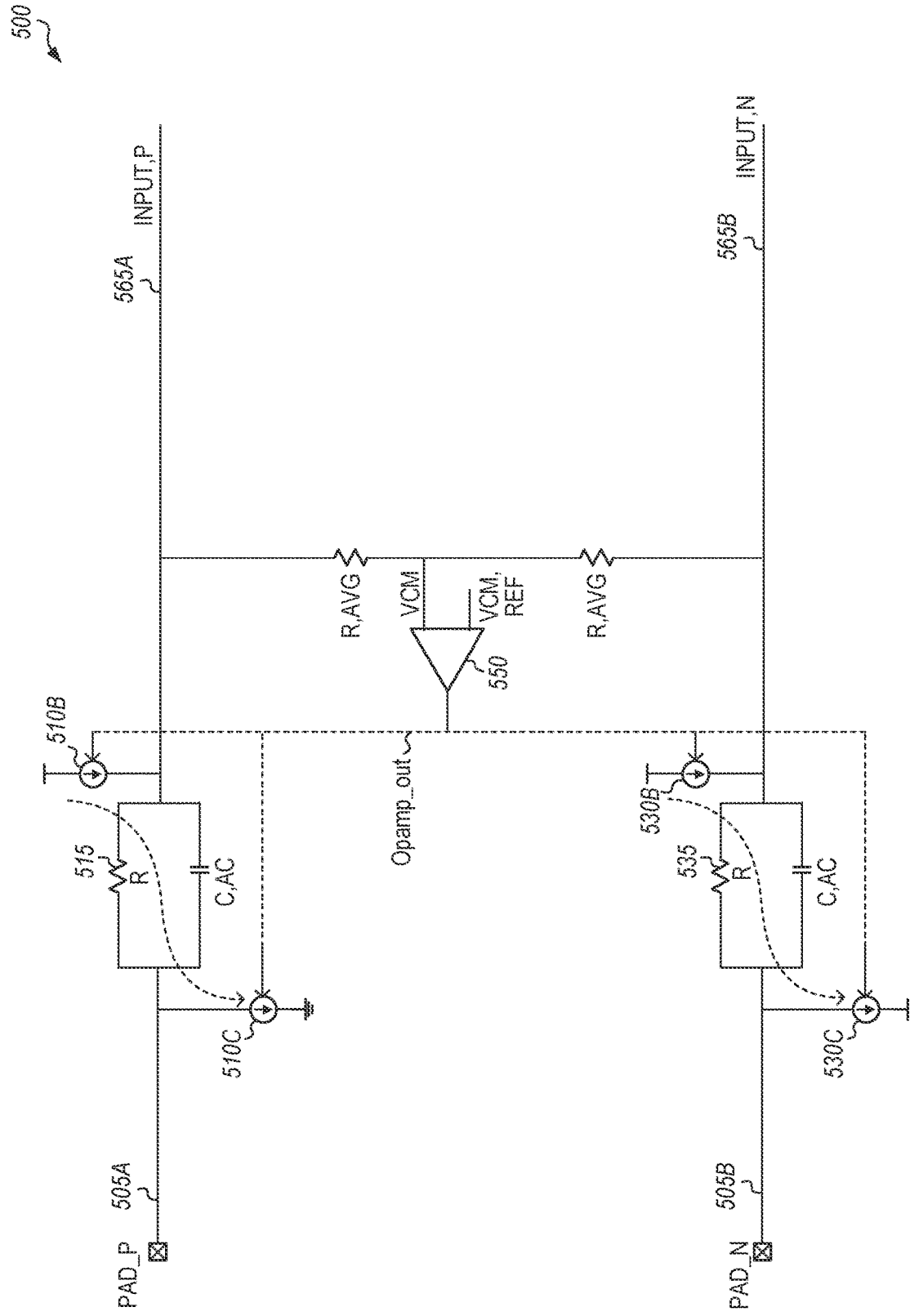
FIG. 5 is a block diagram of another implementation of a receiver circuit.

Referring now to FIG. 5, a block diagram of another implementation of a receiver circuit 500 is shown. Receiver circuit 500 is a variation on the structure of receiver circuit 400 shown in FIG. 4. In a scenario where the voltage difference between the transmitter and receiver is known and the common mode voltage at the input pads 505A-B is lower than the common mode voltage at receiver front end input pads 565A-B, two of the current sources can be omitted from the input and output channels. Accordingly, input signal path 505A is connected to current source 510C which acts as a current sink, and output signal path 565A is connected to current source 510B which supplies current which flows through resistor 515 to current source 510C. Similarly, input signal path 505B is connected to current source 530C which acts as a current sink, and output signal path 565B is connected to current source 530B which supplies current which flows through resistor 535 to current source 530C. The other components of receiver circuit 500 are similar to receiver circuit 400.

Figure 6:
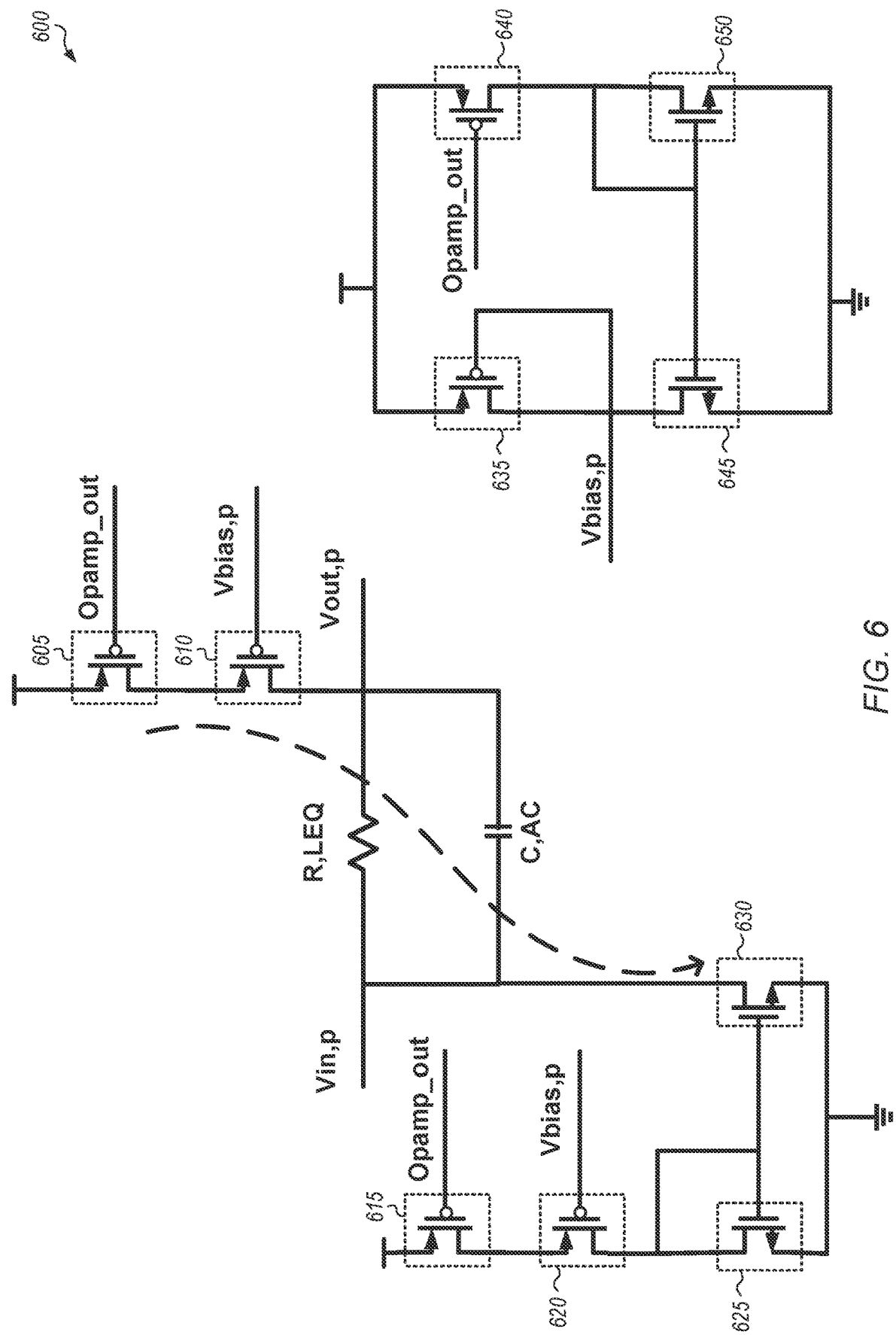
FIG. 6 is a block diagram of one implementation of current source circuitry.

Turning now to FIG. 6, a block diagram of one implementation of current source circuitry 600 is shown. In one embodiment, current sources 510B and 510C (of FIG. 5) are implemented using the components and structure of circuitry 600. The signal labeled "Opamp out" refers to the control signal generated by the op-amp (e.g., op-amp 550). Also, the signal labeled "Vin,p" corresponds to signal path 505A and the signal labeled "Vout,p" corresponds to signal path 565A. As shown in FIG. 6, P-type transistors 605 and 610 are coupled in series between the supply voltage and "Vout,p". P-type transistors 615 and 620 are coupled in series between the supply voltage and the drain of N-type transistor 625. The gates of N-type transistor 625 and N-type transistor 630 are coupled together, with the source ports of N-type transistors 625 and 630 tied to ground, and the drain port of N-type transistor 630 tied to "Vin,p". Also, the source ports of P-type transistors 635 and 640 are tied to the supply voltage, and the drain ports of P-type transistors 635 and 640 are tied to the drain ports of N-type transistors 645 and 650, respectively. The gates of N-type transistors 645 and 650 are tied together and to the drain port of N-type transistor 650, and the source ports of N-type transistors 645 and 650 are tied to ground. The gates of P-type transistors 635 and 610 are tied together and labeled as "Vbias,p". It is noted that the arrangement of transistors shown in circuitry 600 is merely one possible scheme for implementing current sources 510B and 510C and current sources 530B and 530C in accordance with one implementation. In other implementations, other suitable arrangements of circuitry can be used to construct current sources 510B and 510C and current sources 530B and 530C.

Figure 7:
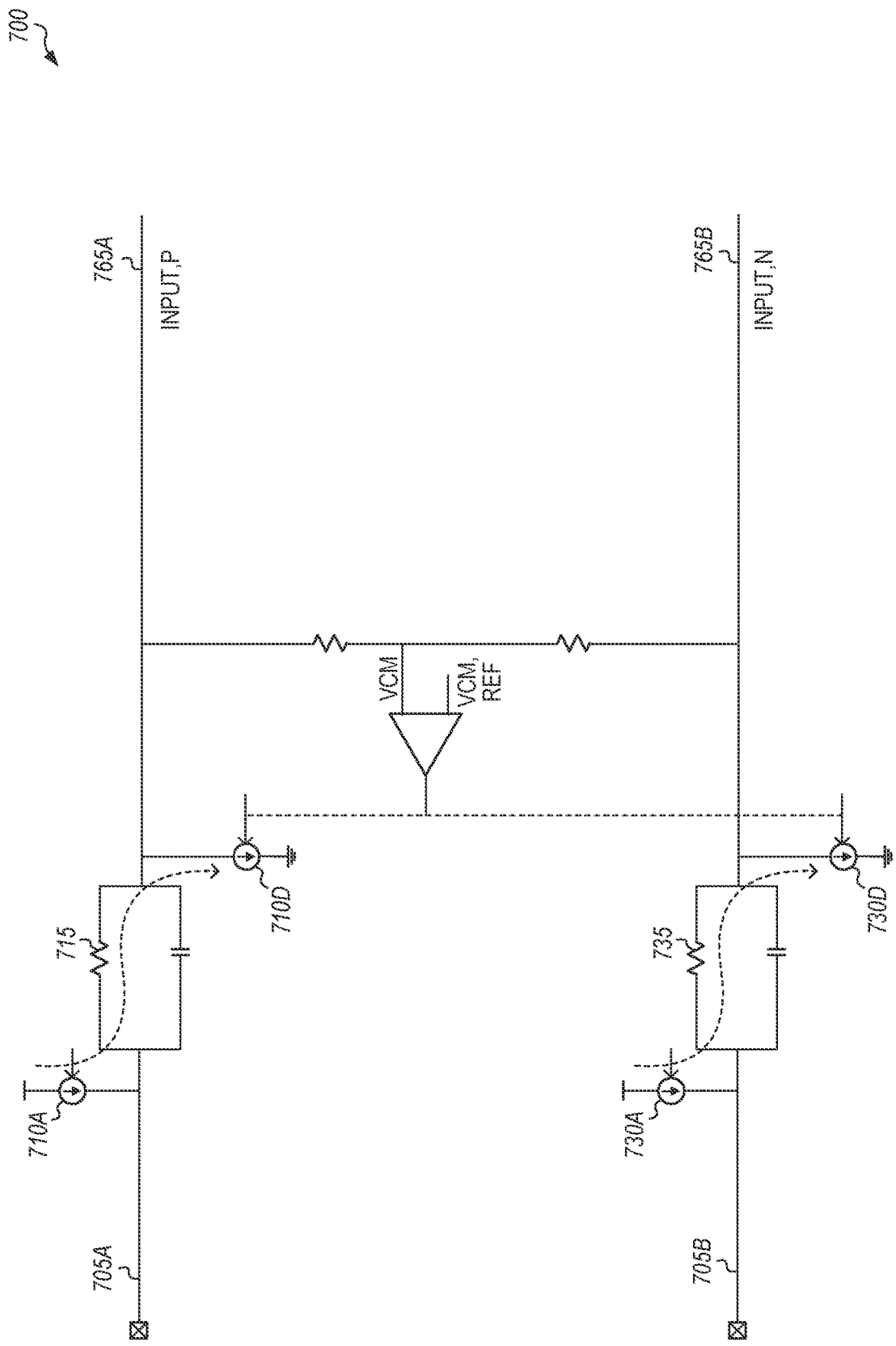
FIG. 7 is a block diagram of another implementation of a receiver circuit.

Turning now to FIG. 7, a block diagram of another implementation of a receiver circuit 700 is shown. Receiver circuit 700 is a variation on the structure of receiver circuit 400 shown in FIG. 4. In a scenario where the voltage difference between the transmitter and receiver is known and the common mode voltage at the input pads 705A-B is higher than the common mode voltage at receiver front end input pads 765A-B, two of the current sources can be omitted from the input and output signal paths. Accordingly, input signal path 705A is connected to current source 710A which supplies current through resistor 715 to current source 710D, and output signal path 765A is connected to current source 710D which acts as a current sink. Similarly, input signal path 705B is connected to current source 730A which supplies current through resistor 735 to current source 730D, and output signal path 765B is connected to current source 730D which acts as a current sink. The other components of receiver circuit 700 are similar to receiver circuit 400.

Figure 8:
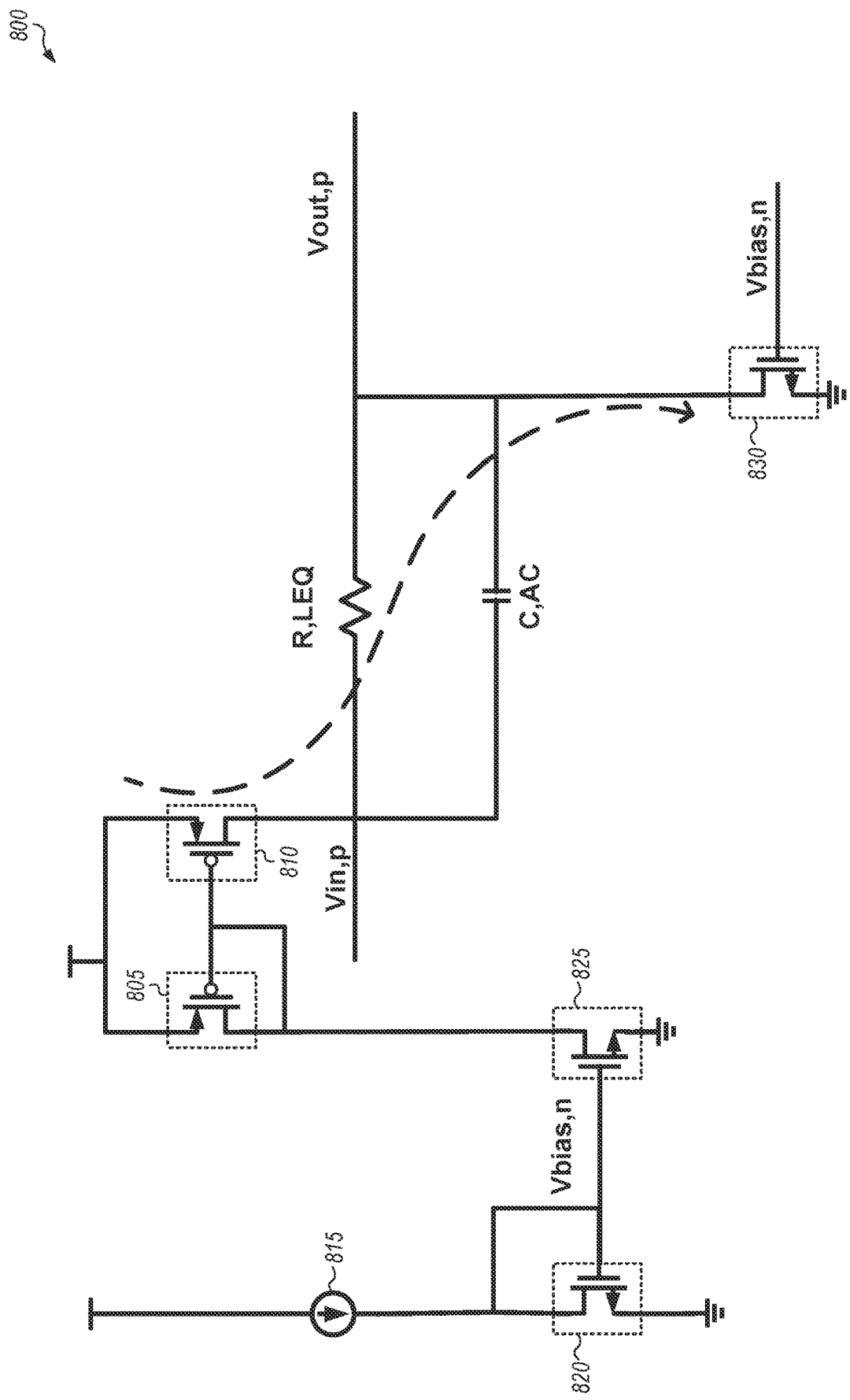
FIG. 8 is a block diagram of one implementation of current source circuitry.

Turning now to FIG. 8, a block diagram of one implementation of current source circuitry 800 is shown. In one embodiment, current sources 710A and 710D (of FIG. 7) are implemented using the components and structure of circuitry 800. The signal labeled "Vin,p" corresponds to signal path 705A and the signal labeled "Vout,p" corresponds to signal path 765A. As shown in FIG. 8, the source ports of P-type transistors 805 and 810 are connected to the supply voltage, with the gates of P-type transistors 805 and 810 connected together and to the drain port of P-type transistor 805. The drain port of P-type transistor 810 is coupled to the signal labeled "Vin,p". The signal labeled "Vout,p" is connected to the drain port of N-type transistor 830, with the gate of N-type transistor 830 connected to the gates of N-type transistors 820 and 825 and labeled as "Vbias,n". The drain port of N-type transistor 825 is connected to the drain port of P-type transistor 805. Current source 815 is connected in between the supply voltage and the drain port of N-type transistor 820. The source ports of N-type transistors 820, 825, and 830 are connected to ground. It is noted that the arrangement of transistors shown in circuitry 800 is merely one possible scheme for implementing current sources 710A and 710D and current sources 730A and 730D in accordance with one implementation. In other implementations, other suitable arrangements of circuitry can be used to construct current sources 710A and 710D and current sources 730A and 730D.

Figure 9:
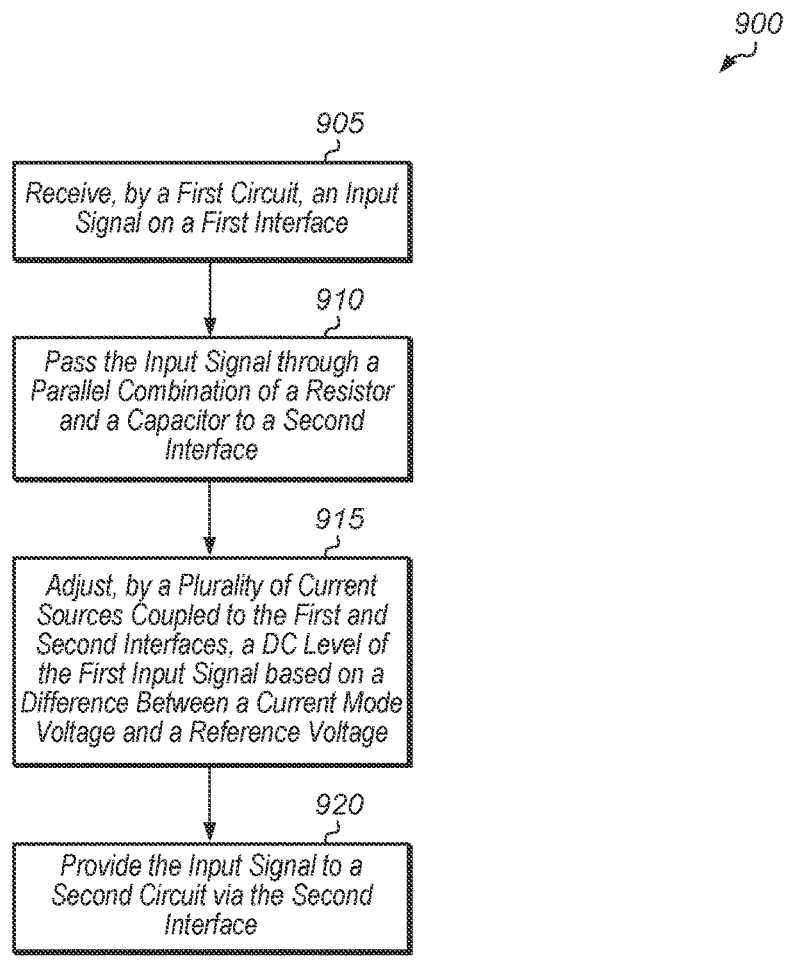
FIG. 9 is a generalized flow diagram illustrating one implementation of a method for employing a combination scheme for direct current level shifting of signals.
Figure 10:
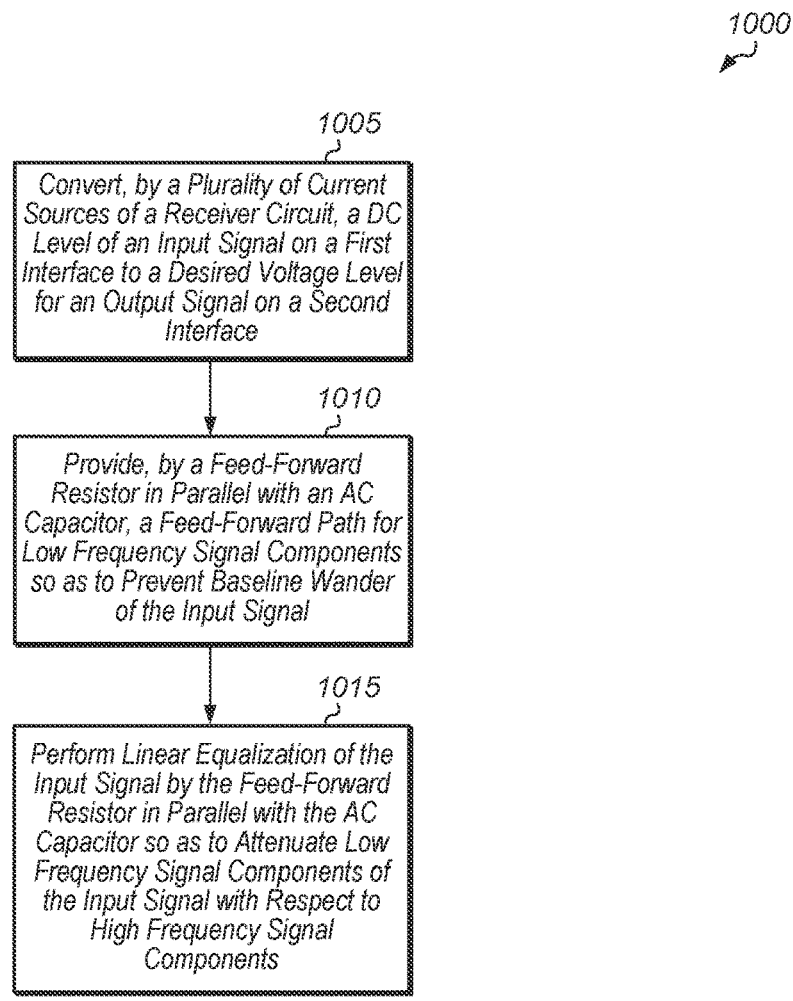
FIG. 10 is a generalized flow diagram illustrating one implementation of a method for preventing baseline wander, performing DC level adjustment, and achieving linear equalization.
Figure 11:
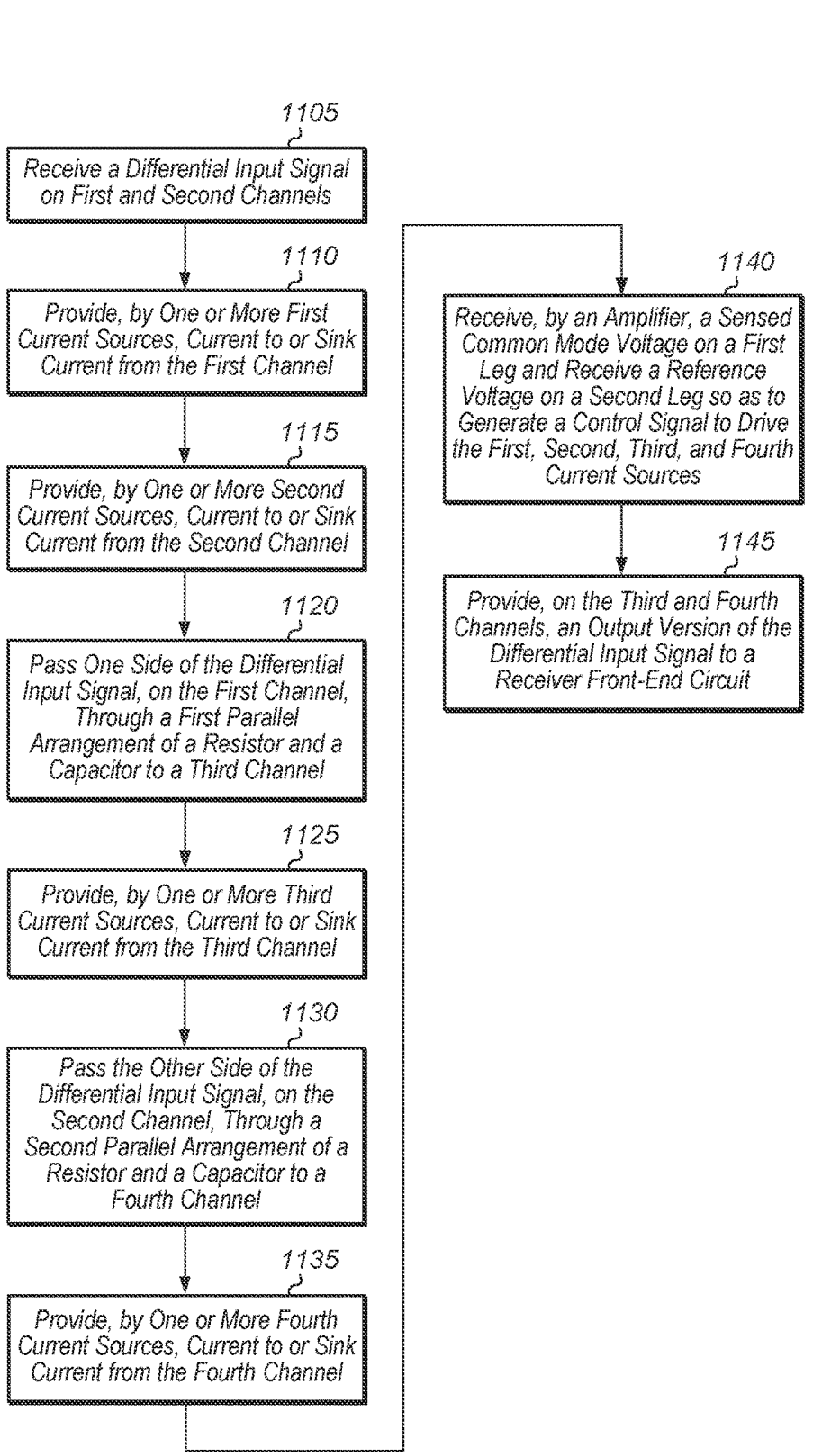
FIG. 11 is a generalized flow diagram illustrating one implementation of a method for receiving and conditioning a differential data signal.
Figure 12:
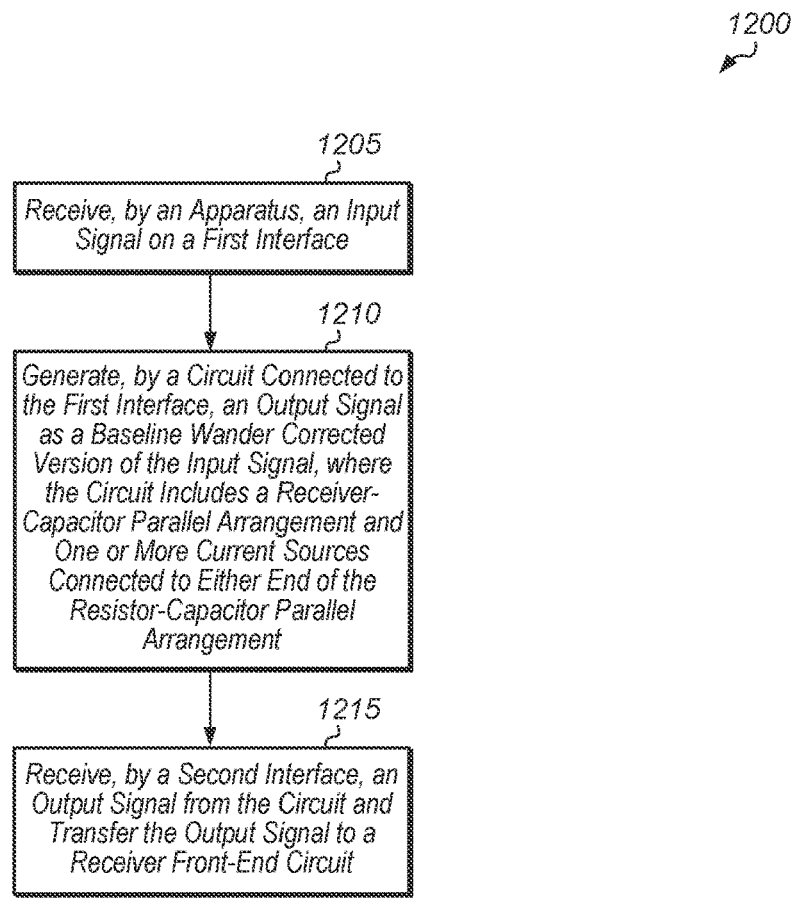
FIG. 12 is a generalized flow diagram illustrating one implementation of a method for generating a baseline wander corrected version of an input signal.

Referring now to FIG. 9, one implementation of a method 900 for employing a combination scheme for direct current level shifting of signals is shown. For purposes of discussion, the steps in this implementation and those of FIG. 10-12 are shown in sequential order. However, it is noted that in various implementations of the described methods, one or more of the elements described are performed concurrently, in a different order than shown, or are omitted entirely. Other additional elements are also performed as desired. Any of the various systems or apparatuses described herein are configured to implement method 900 (and methods 1000-1200).

A first circuit receives an input signal on a first interface (block 905). The input signal can be one side (e.g., either positive or negative) of a differential signal or a single-ended signal, depending on the implementation. It is noted that the first interface can also be referred to as a first signal path, a first signal line, a first pad, a first node, or a first transmission line. The input signal passes through a parallel combination of a resistor and capacitor to a second interface (block 910). The resistor provides a feed-forward path for low frequency components. A plurality of current sources, coupled to the first and second interfaces, adjust a direct current (DC) level of the first input signal based on a difference between a current mode voltage and a reference voltage (block 915). The plurality of first current sources can include four current sources or eight current sources, depending on the implementation. The input signal is provided to a second circuit via the second interface (block 920). In one implementation, the second circuit is a receiver front-end circuit. After block 920, method 900 ends.

Turning now to FIG. 10, one implementation of a method 1000 for preventing baseline wander, performing DC level adjustment, and achieving linear equalization is shown. A plurality of current sources of a receiver circuit convert a direct current (DC) level of an input signal on a first interface to a desired reference voltage of an output signal on a second interface (block 1005). A feed-forward resistor, in parallel with an alternating current (AC) capacitor, provides a feed-forward resistor path for low frequency signal components so as to prevent baseline wander of the input signal (block 1010). Also, the feed-forward resistor in parallel with the AC capacitor performs linear equalization of the input signal so as to attenuate low frequency signal components of the input signal with respect to high frequency signal components (block 1015). After block 1015, method 1000 ends. As a result of performing method 1000, the input signal is passed from the first interface to the second interface while achieving three goals of preventing baseline wander, adjusting the DC level, and undergoing linear equalization.

Referring now to FIG. 11, one implementation of a method 1100 for receiving and conditioning a differential data signal is shown. A receiver circuit receives a differential input signal on first and second signal paths (block 1105). It is noted that the first signal path can be a wire, a trace, or other physical connection medium, and the second signal path can be a wire, a trace, or other physical connection medium separate and distinct from the first channel. One or more first current sources provide (i.e., supply) current to or sink current from the first signal path (block 1110). One or more second current sources provide current to or sink current from the second signal path (block 1115).

One side of the differential input signal is passed, on the first signal path, through a first parallel arrangement of a resistor and a capacitor to a third signal path (block 1120). One or more third current sources provide current to or sink current from the third signal path (block 1125). Also, the other side of the differential input signal is passed, on the second signal path, through a second parallel arrangement of a resistor and a capacitor to a fourth signal path (block 1130). One or more fourth current sources provide current to or sink current from the fourth signal path (block 1135). An amplifier (e.g., op-amp) receives a sensed common mode voltage on a first leg and a reference voltage on a second leg to generate a control signal to drive the first, second, third, and fourth current sources (block 1140). An output version of the input differential signal is provided on the third and fourth signal paths to a receiver front-end circuit (block 1145). After block 1145, method 1100 ends. By performing method 1100, the output version of the differential signal avoids baseline wander, undergoes a DC level shift, and achieves linear equalization.

Turning now to FIG. 12, one implementation of a method 1200 for generating a baseline wander corrected version of an input signal is shown. An apparatus receives an input signal on a first interface (block 1205). In one implementation, the input signal is a differential signal. In another implementation, the input signal is a single-ended signal. In a further implementation, the input signal is one signal of a differential signal pair. A circuit connected to the first interface generates an output signal as a baseline wander corrected version of the input signal, where the circuit includes a receiver-capacitor parallel arrangement and one or more current sources connected to either end of the resistor-capacitor parallel arrangement (block 1210). A second interface receives the output signal from the circuit and transfers the output signal to a receiver front-end circuit (block 1215). After block 1215, method 1200 ends. It is noted that in addition to generated a baseline wander corrected version of the input signal, the circuit can also shift a DC level of the input signal and perform linear equalization at relatively low frequencies.

Figure 13:
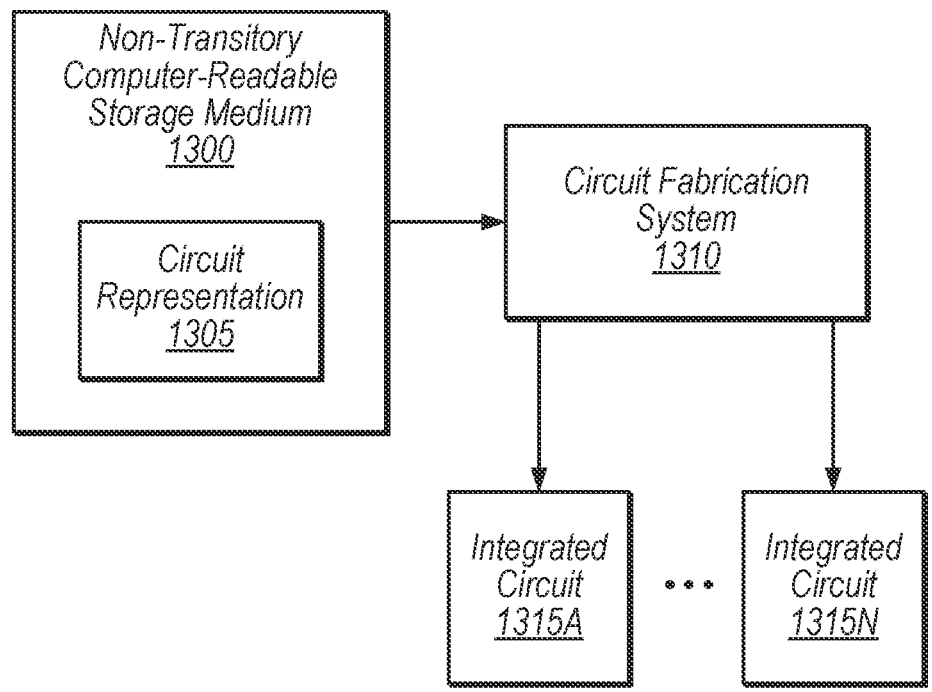
FIG. 13 is a block diagram illustrating one implementation of a non-transitory computer-readable storage medium that stores a circuit representation.

Turning now to FIG. 13, a block diagram illustrating one implementation of a non-transitory computer-readable storage medium 1300 that stores a circuit representation 1305 is shown. In one implementation, circuit fabrication system 1310 processes the circuit representation 1305 stored on non-transitory computer-readable storage medium 1300 and fabricates any number of integrated circuits 1315A-N based on the circuit representation 1305.

Non-transitory computer-readable storage medium 1300 can include any of various appropriate types of memory devices or storage devices. Medium 1300 can be an installation medium (e.g., a thumb drive, CD-ROM), a computer system memory or random access memory (e.g., DRAM, DDR RAM, SRAM, EDO RAM, Rambus RAM), a non-volatile memory (e.g., a Flash, magnetic media, a hard drive, optical storage), registers, or other types of memory elements. Medium 1300 can include other types of non-transitory memory as well or any combinations thereof. Medium 1300 can include two or more memory mediums which reside in different locations (e.g., in different computer systems that are connected over a network).

In various implementations, circuit representation 1305 is specified using any of various appropriate computer languages, including hardware description languages such as, without limitation: VHDL, Verilog, SystemC, SystemVerilog, RHDL, etc. Circuit representation 1305 is usable by circuit fabrication system 1310 to fabricate at least a portion of one or more of integrated circuits 1315A-N. The format of circuit representation 1305 is recognizable by at least one circuit fabrication system 1310. In some implementations, circuit representation 1305 includes one or more cell libraries which specify the synthesis and/or layout of the integrated circuits 1315A-N.

Circuit fabrication system 1310 includes any of various appropriate elements configured to fabricate integrated circuits. This can include, for example, elements for depositing semiconductor materials (e.g., on a wafer, which can include masking), removing materials, altering the shape of deposited materials, modifying materials (e.g., by doping materials or modifying dielectric constants using ultraviolet processing), etc. Circuit fabrication system 1310 can also perform testing of fabricated circuits for correct operation.

In various implementations, integrated circuits 1315A-N operate according to a circuit design specified by circuit representation 1305, which can include performing any of the functionality described herein. For example, integrated circuits 1315A-N can include any of various elements shown in the circuits illustrated herein and/or multiple instances of the circuit illustrated herein. Furthermore, integrated circuits 1315A-N can perform various functions described herein in conjunction with other components. For example, integrated circuits 1315A-N can be coupled to voltage supply circuitry that is configured to provide a supply voltage (e.g., as opposed to including a voltage supply itself). Further, the functionality described herein can be performed by multiple connected integrated circuits.

As used herein, a phrase of the form "circuit representation that specifies a design of a circuit . . . " does not imply that the circuit in question must be fabricated in order for the element to be met. Rather, this phrase indicates that the circuit representation describes a circuit that, upon being fabricated, will be configured to perform the indicated actions or will include the specified components.

It should be emphasized that the above-described implementations are only non-limiting examples of implementations. The implementations are applied for up-scaled, down-scaled, and non-scaled images. Numerous variations and modifications will become apparent to those skilled in the art once the above disclosure is fully appreciated. It is intended that the following claims be interpreted to embrace all such variations and modifications.

What is claimed is:

1. An apparatus comprising:
   a first interface configured to receive a first input signal from a transmission line;
   a circuit coupled to the first interface and configured to generate an output signal as a baseline wander corrected version of the first input signal, wherein the circuit comprises:
      a resistor-capacitor parallel arrangement; and
      one or more current sources connected to a first end of the resistor-capacitor parallel arrangement; and
      one or more current sources connected to a second end of the resistor-capacitor parallel arrangement, wherein each current source on each of the first end and the second end is configured to receive a control signal based on a sensed common mode voltage of the first input signal and a second input signal different from the first input signal; and
   a second interface configured to receive the output signal from the circuit.

2. The apparatus as recited in claim 1, wherein the circuit comprises:
   a first resistor of the resistor-capacitor parallel arrangement, wherein a first leg of the first resistor is coupled to the first interface, wherein a second leg of the first resistor is coupled to the second interface;
   a first capacitor of the resistor-capacitor parallel arrangement, wherein a first leg of the first capacitor is coupled to the first interface, wherein a second leg of the first capacitor is coupled to the second interface;
   a first current source coupled to the first interface; and
   a second current source coupled to the second interface.

3. The apparatus as recited in claim 2, wherein the apparatus is further configured to:
   shift a direct current (DC) level of the first input signal from the first interface to the second interface based on an arrangement of the first resistor, the first capacitor, the first current source, and the second current source; and
   perform linear equalization at relatively low frequencies based on the arrangement of the first resistor, the first capacitor, the first current source, and the second current source.

4. The apparatus as recited in claim 3, wherein the circuit further comprises an operational amplifier configured to:
   generate the control signal by comparing a desired common mode reference voltage and the sensed common mode voltage of the first input signal and the second input signal, wherein each of the first input signal and the second input signal is one of a positive signal and a negative signal of a differential signal; and
   drive the first current source and the second current source.

5. The apparatus as recited in claim 4, wherein the circuit further comprises:
   a third current source, wherein a first leg of the third current source is coupled to the first interface; and
   a fourth current source, wherein a first leg of the fourth current source is coupled to the second interface.

6. The apparatus as recited in claim 5, wherein:
   a second leg of the first current source is coupled to a voltage supply;
   a second leg of the second current source is coupled to ground;
   a second leg of the third current source is coupled to ground;
   a second leg of the fourth current source is coupled to the voltage supply; and
   the operational amplifier is configured to drive the third current source and the fourth current source.

7. The apparatus as recited in claim 6, wherein the operational amplifier is further configured to:
   receive, on a first input leg, a common mode voltage on the first interface;
   receive, on a second input leg, a reference voltage for the second interface; and
   generate the control signal to drive the first current source, the second current source, the third current source, and the fourth current source based on a difference between voltages on the first input leg and the second input leg.

8. A method comprising:
   receiving, by a first circuit, a first input signal from a transmission line on a first signal path and a second input signal different from the first input signal on a second signal path;
   providing, by one or more first current sources, current to or sinking current from the first signal path;

providing, by one or more second current sources, current to or sinking current from the second signal path;

passing, to a third signal path from the first signal path, the first input signal through a first resistor-capacitor parallel arrangement;

providing, by one or more third current sources, current to or sinking current from the third signal path;

passing, to a fourth signal path from the second signal path, the second input signal through a second resistor-capacitor parallel arrangement, wherein each current source on either end of the first resistor-capacitor parallel arrangement and each current source on either end of the second resistor-capacitor parallel arrangement is configured to receive a given control signal based on a sensed common mode voltage of the first input signal and a second input signal;

providing, by one or more fourth current sources, current to or sinking current from the fourth signal path; and providing, on the third and fourth signal paths, an output version of the first input signal and the second input signal to a second circuit.

9. The method as recited in claim 8, further comprising:
receiving, by an amplifier, the sensed common mode voltage on a first leg, wherein each of the first input signal and the second input signal is one of a positive signal and a negative signal of a differential signal;
receiving, by the amplifier, a desired common mode reference voltage on a second leg;
generating the given control signal based on the sensed common mode voltage and the desired common mode reference voltage; and
driving the given control signal to each of the one or more first current sources, the one or more second current sources, the one or more third current sources, and the one or more fourth current sources.

10. The method as recited in claim 8, wherein the one or more first current sources comprise:
a first given current source with a first leg coupled to a supply voltage and a second leg coupled to the first signal path; and
a second given current source with a first leg coupled to the first signal path and a second leg coupled to ground.

11. The method as recited in claim 8, wherein the one or more second current sources comprise:
a first given current source with a first leg coupled to a supply voltage and a second leg coupled to the second signal path; and
a second given current source with a first leg coupled to the second signal path and a second leg coupled to ground.

12. The method as recited in claim 8, wherein the one or more third current sources comprise:
a first given current source with a first leg coupled to a supply voltage and a second leg coupled to the third signal path; and
a second given current source with a first leg coupled to the third signal path and a second leg coupled to ground.

13. The method as recited in claim 8, wherein the one or more fourth current sources comprise:

a first given current source with a first leg coupled to a supply voltage and a second leg coupled to the fourth signal path; and
a second given current source with a first leg coupled to the fourth signal path and a second leg coupled to ground.

14. The method as recited in claim 8, wherein the second circuit is a receiver front-end circuit.

15. A system comprising:
a first resistor comprising:
a first leg connected to a first line of a first interface configured to receive a first input signal from a transmission line; and
a second leg connected to a first line of a second interface;
a first current sink connected to the first line of the first interface;
a first current source connected to the first line of the first interface;
a second current sink connected to the first line of the second interface; and
a second current source connected to the first line of the second interface, wherein each of the first current source, the first current sink, the second current source, and the second current sink, is configured to receive a given control signal based on a sensed common mode voltage of the first input signal and a second input signal different from the first input signal.

16. The system as recited in claim 15, wherein the second interface is a receiver front-end circuit.

17. The system as recited in claim 15, further comprising an operational amplifier configured to generate the given control signal by comparing a desired common mode reference voltage and the sensed common mode voltage of the first input signal and the second input signal, wherein each of the first input signal and the second input signal is one of a positive signal and a negative signal of a differential signal.

18. The system as recited in claim 15, further comprising a first capacitor comprising:
a first leg connected to the first line of the first interface; and
a second leg connected to the first line of the second interface.

19. The system as recited in claim 15, further comprising:
a second resistor comprising:
a first leg connected to a second line of the first interface; and
a second leg connected to a second line of the second interface;
a third current sink connected to the second line of the first interface;
a third current source connected to the second line of the first interface;
a fourth current sink connected to the second line of the second interface; and
a fourth current source connected to the second line of the second interface.

20. The system as recited in claim 19, wherein the given control signal is coupled to the third current sink, the third current source, the fourth current sink, and the fourth current source.

* * * * *